United States Patent
Rosu-Hamzescu

(10) Patent No.: US 9,035,635 B2
(45) Date of Patent: May 19, 2015

(54) USING SYNCHRONOUS CONVERTER IN ASYNCHRONOUS MODE TO PREVENT CURRENT REVERSAL DURING BATTERY CHARGING

(71) Applicant: Microchip Technology Incorporated, Chandler, AZ (US)

(72) Inventor: Mihnea Rosu-Hamzescu, Bucharest (RO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 103 days.

(21) Appl. No.: 13/786,451

(22) Filed: Mar. 6, 2013

(65) Prior Publication Data
US 2014/0253086 A1 Sep. 11, 2014

(51) Int. Cl.
*G05F 1/00* (2006.01)
*H02M 3/337* (2006.01)
*H02J 7/00* (2006.01)
*H02M 1/00* (2006.01)

(52) U.S. Cl.
CPC .............. *H02M 3/337* (2013.01); *H02J 7/0052* (2013.01); *H02J 2007/0059* (2013.01); *H02M 2001/0058* (2013.01)

(58) Field of Classification Search
USPC .................................. 323/222, 271, 282–285
See application file for complete search history.

(56) References Cited

U.S. PATENT DOCUMENTS

| | | | | |
|---|---|---|---|---|
| 6,437,549 B1 * | 8/2002 | Takagishi | ........................ | 323/282 |
| 2010/0026256 A1 * | 2/2010 | Liu et al. | ........................ | 323/282 |
| 2010/0213910 A1 * | 8/2010 | Chen | ............................ | 323/282 |
| 2012/0169308 A1 | 7/2012 | Dearborn et al. | ............. | 323/271 |
| 2012/0319662 A1 * | 12/2012 | Kung | ............................ | 323/271 |

FOREIGN PATENT DOCUMENTS

| | | | | |
|---|---|---|---|---|
| CN | 201639474 U | 11/2010 | ............ | H02M 3/155 |
| DE | 3842169 A1 | 6/1990 | ............. | H02H 3/087 |
| DE | 19516208 C1 | 7/1996 | ............. | F02P 17/12 |
| GB | 2300530 A | 11/1996 | ............. | F02P 17/12 |

OTHER PUBLICATIONS

International Search Report and Written Opinion, Application No. PCT/US2014/019314, 11 pages.

* cited by examiner

*Primary Examiner* — Nguyen Tran
(74) *Attorney, Agent, or Firm* — King & Spalding L.L.P.

(57) ABSTRACT

Efficiency of a switch mode power supply (SMPS) is optimized by operating the SMPS in an asynchronous mode when current being supplied therefrom is less than a certain current value and operating the SMPS in a synchronous mode when the current being supplied therefrom is equal to or greater than the certain current value. When the SMPS is operating in the synchronous mode high-side and low-side power transistors alternately turn on and off. When the SMPS is operating in the asynchronous mode only the high-side power transistor turns on and off and the low-side power transistor remains off. When charging a battery with the SMPS discharge of the battery is eliminated when operating in the asynchronous mode at a low current output.

7 Claims, 7 Drawing Sheets

USING SYNCHRONOUS CONVERTER IN ASYNCHRONOUS MODE TO PREVENT CURRENT REVERSAL DURING BATTERY CHARGING

TECHNICAL FIELD

The present disclosure relates to switch-mode power supply (SMPS) battery chargers, and, more particularly, to a way of using a synchronous SMPS in an asynchronous mode to prevent current reversal during battery charging.

BACKGROUND

High power switch mode power supply (SMPS) battery chargers require synchronous rectification converters to achieve high efficiency. However, when the synchronous rectification converter operates in a discontinuous conduction mode (DCM) there is a possibility that the synchronous rectification converter will draw current from the battery being charged for a short period of time and inject that current into the input side (power source) of the synchronous rectification converter. In addition, efficiency of the SMPS suffers because the rectification transistor may discharge the output capacitor during DCM operation. This phenomenon is called battery current reversal and may lead to destruction of the synchronous rectification converter of the SMPS. Battery current reversal in an SMPS never happens when using diode rectification in an asynchronous rectification converter because the diode only lets current flow in one direction (correct direction) compared to a power metal oxide semiconductor field effect transistor (MOSFET) which allows current to flow in both directions. But efficiency is poorer when using an asynchronous rectification converter instead of the more efficient synchronous rectification converter in a SMPS battery charger. This is very important when designing high power capacity battery chargers, e.g., electric vehicle charging stations.

Prior technology solutions to the aforementioned problem of battery current reversal have been putting a power diode in series with the battery under charge but this is not an ideal solution since the power diode will dissipate a great deal of power at high current battery charging levels. Another prior technology solution has been placing a high current switch in series with the battery being charged, but requires additional components of which the high power components can be expensive. Still another prior technology solution has been to force a normally synchronous rectification converter into a diode emulation mode of operation so as to simulate asynchronous operation thereof. This requires a very fast comparator to detect when the SMPS inductor current drops to substantially zero and then contemporaneously thereafter disable the low side power MOSFET until there is inductor current present again.

SUMMARY

Therefore a need exists for a way to maintain high efficiency in a high power SMPS battery charger without drawing current from the battery being charged during low or no current operation that may cause a discontinuous operating mode thereof.

According to an embodiment, a switch-mode power supply (SMPS) having selectable asynchronous and synchronous converter modes may comprise: a high-side power transistor; a low-side power transistor coupled in series with the high-side power transistor, wherein the high-side power transistor may also be coupled to a power source and the low-side power transistor may also be coupled to a power source common; a power diode coupled in parallel with the low-side power transistor; a filter capacitor; a power inductor having a first end coupled to a junction between the high-side and the low-side power transistors and a second end coupled to the filter capacitor; a current sensor; and a power controller having a high-drive output coupled to a control input of the high-side power transistor, a low-drive output coupled to a control input of the low-side power transistor, a voltage sense input coupled to the filter capacitor, and a current sense input coupled to the current sensor; wherein when a current measured by the current sensor may be less than a certain current value the power controller only turns on and off the high-side power transistor and maintains the low-side power transistor off, and when the current measured by the current sensor may be equal to or greater than the certain current value the power controller turns on and off the high-side power transistor and turns off and on the low-side power transistor, whereby when the high-side power transistor may be on the low-side power transistor may be off, and when the high-side power transistor may be off the low-side power transistor may be on.

According to a further embodiment, the controller provides a dead time when both the high-side and the low-side power transistors may be off before one of the power transistors may be turned back on. According to a further embodiment, the high-side and low-side power transistors may be power metal oxide semiconductor (MOS) field effect transistors (FETs) and the power diode comprises a body diode of the low-side power MOSFET. According to a further embodiment, the power controller comprises a pulse width modulation (PWM) generator and a dual power transistor driver. According to a further embodiment, the power controller comprises a microcontroller. According to a further embodiment, a battery may be coupled to the second end of the power inductor, wherein the battery may be charged thereby. According to a further embodiment, the certain current value may be substantially less than a maximum current value of the SMPS. According to a further embodiment, the certain current value may be greater than zero amperes. According to a further embodiment, when the current measured by the current sensor may be less than the certain current value the SMPS may operate in the asynchronous converter mode. According to a further embodiment, when the current measured by the current sensor may be equal to or greater than the certain current value the SMPS may operate in the synchronous converter mode.

According to another embodiment, a switch-mode power supply (SMPS) having selectable asynchronous and synchronous converter modes may comprise: a high-side power transistor; a low-side power transistor coupled in series with the high-side power transistor; a power diode coupled in parallel with the low-side power transistor; at filter capacitor coupled in parallel with the series connected high-side and low-side power transistors; a power inductor having a first end coupled to a junction between the high-side and the low-side power transistors and a second end coupled to a power source; a current sensor; and a dual power transistor driver having a high-drive output coupled to a control input of the high-side power transistor, a low-drive output coupled to a control input of the low-side power transistor, and a pulse width modulation (PWM) input adapted for receiving three voltage levels, wherein when the PWM input may be at a low logic level the low-drive output may be asserted and the low-side power transistor may be on, when the PWM input may be at a high logic level the high-drive output may be asserted and the high-side power transistor may be on, and when the PWM input may be at a half logic level the high-drive and low-drive outputs may both be deasserted and the high-side and low-side power transistors may both be off; first and second resistors having first ends coupled to the PWM input of the dual power transistor driver, wherein the first and second resistors may be substantially the same resistances; and a microcontroller having a PWM output coupled to a second end of the first resistor, a digital output coupled to a second end of the second power resistor, a voltage sense input coupled to the filter capacitor, and a current sense input coupled to the current sensor; wherein the microcontroller supplies a PWM signal from the PWM output thereof and has a duty cycle determined by a voltage on the filter capacitor compared to a voltage reference; wherein when a current measured by the current sensor may be less than a certain current value a logic level from the digital output may be opposite to a logic level from the PWM output and the PWM input may be at the half logic level, and when the current measured by the current sensor may be equal to or greater than the certain current value the logic level from the digital output may be at the same logic level as the logic level from the PWM output, and the PWM input may be at the same logic level as the PWM output from the microcontroller According to a further embodiment, the high-side and low-side power transistors are power metal oxide semiconductor (MOS) field effect transistors (FETs) and the power diode comprises a body diode of the low-side power MOSFET. According to a further embodiment, a battery may be coupled to the filter capacitor, wherein the battery may be charged thereby. According to a further embodiment, the certain current value may be substantially less than a maximum current value of the SMPS. According to a further embodiment, the certain current value may be greater than zero amperes. According to a further embodiment, when the current measured by the current sensor may be less than the certain current value the SMPS may operate in the asynchronous converter mode. According to a further embodiment, when the current measured by the current sensor may be equal to or greater than the certain current value the SMPS may operate in the synchronous converter mode.

According to yet another embodiment, a method for optimizing efficiency of a switch-mode power supply (SMPS) may comprise the steps of: operating the SMPS in an asynchronous mode when current being supplied therefrom may be less than a certain current value; and operating the SMPS in a synchronous mode when the current being supplied therefrom may be equal to or greater than the certain current value.

According to a further embodiment of the method, when the SMPS may be operating in the synchronous mode high-side and low-side power transistors may alternately turn on and off. According to a further embodiment of the method, when the SMPS may be operating in the asynchronous mode only the high-side power transistor may turn on and off and the low-side power transistor may remain off.

BRIEF DESCRIPTION OF THE DRAWINGS

A more complete understanding of the present disclosure may be acquired by referring to the following description taken in conjunction with the accompanying drawings wherein.

Figure 1:
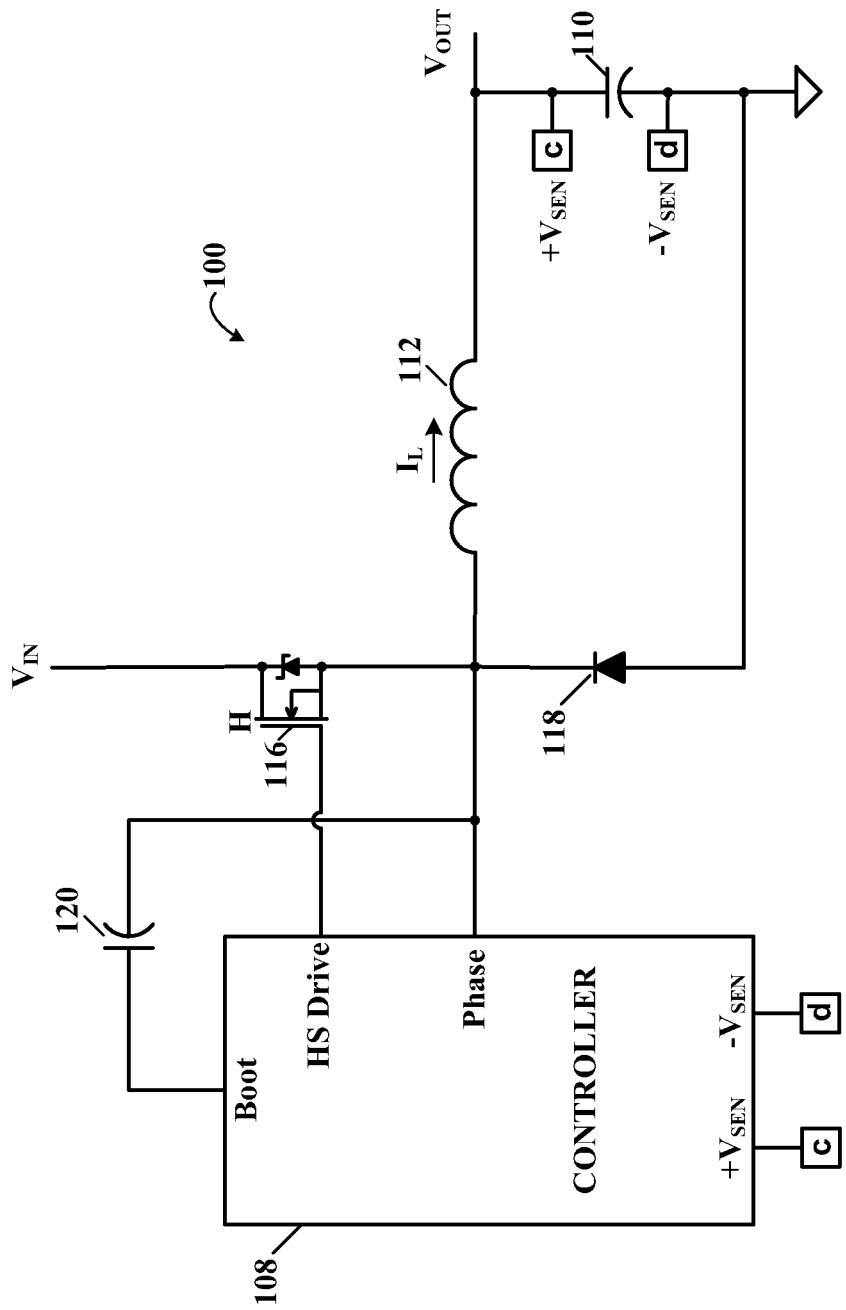
FIG. 1 illustrates a schematic diagram of a typical SMPS having an asynchronous converter.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

To circumvent battery current reversal and efficiency problems during discontinuous conduction mode (DCM) operation of a synchronous switch mode power supply (SMPS) it is sufficient to drive the SMPS converter asynchronously when at low output currents. This may be accomplished by using only the main transistor switch and let the body diode of the rectification transistor or an additional diode parallel thereto do the rest. Wherein synchronous converter rectification mode may be re-enabled when output charging current is high enough again, e.g., during continuous conduction mode (CCM), or disabled when the output charging current is less than a predefined current value.

Another way is to use a SMPS driver integrated circuit (IC) device, such as, for example but not limited to, a Microchip MCP14628 synchronous buck power metal oxide semiconductor field effect transistor (MOSFET) driver, specifications available at Microchip.com, and is hereby incorporated by reference herein for all purposes. The MCP14628 or any other SMPS driver IC having similar capabilities may use the half supply bias feature of the pulse width modulation (PWM) input and two additional resistors as more fully described hereinbelow.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic diagram of a typical SMPS having an asynchronous converter. An asynchronous converter of a SMPS, generally represented by the numeral 100, comprises a controller 108, a first power switch (power transistor), e.g., a power metal oxide semiconductor field effect transistor (MOSFET) 116; a second power switch (power transistor), e.g., a power diode 118; an inductor 112, a boot capacitor 120 and an output capacitor 110. The first and second power switches 116 and 118 control power to a load (not shown) connected at Vout. When the first power switch 116 is on, a supply voltage, Vin, charges the inductor 112 and the capacitor 110 whereby current is supplied to the load (not shown). When a voltage on the capacitor 110 reaches a predefined set point voltage measured at +Vsen and −Vsen, the controller 108 turns off the first power switch 116 thereby interrupting the current, $I_L$, flowing through the inductor 112. With no path for the current, $I_L$, the inductor 112 will resist this change in the form of a large voltage spike caused by the collapsing magnetic field surrounding the inductor coil. This collapsing magnetic field causes a voltage of the opposite polarity to be generated. Wherein this opposite polarity voltage forward biases the second power switch 118 (diode) that now provides a current path for the current, $I_L$, to continue flowing throw the inductor 112 in the same direction as before the first power switch 116 was turned off by the controller 108. When the current, $I_L$, flows in the second power switch 118 (diode), the second power switch 118 is said to be in a "freewheel" mode. When the output voltage, Vout, drops below the predefined set point voltage, the controller 108 will turn back on the first power switch 116. Whereby the second power switch 118 (diode) will again be back biased and all current through the inductor 112 will be provided from the supply voltage, Vin, through the first power switch 116. This cycling of the first power switch 116 on and off continues so as to maintain the output voltage, Vout, at substantially the predefined set point voltage.

Figure 2:
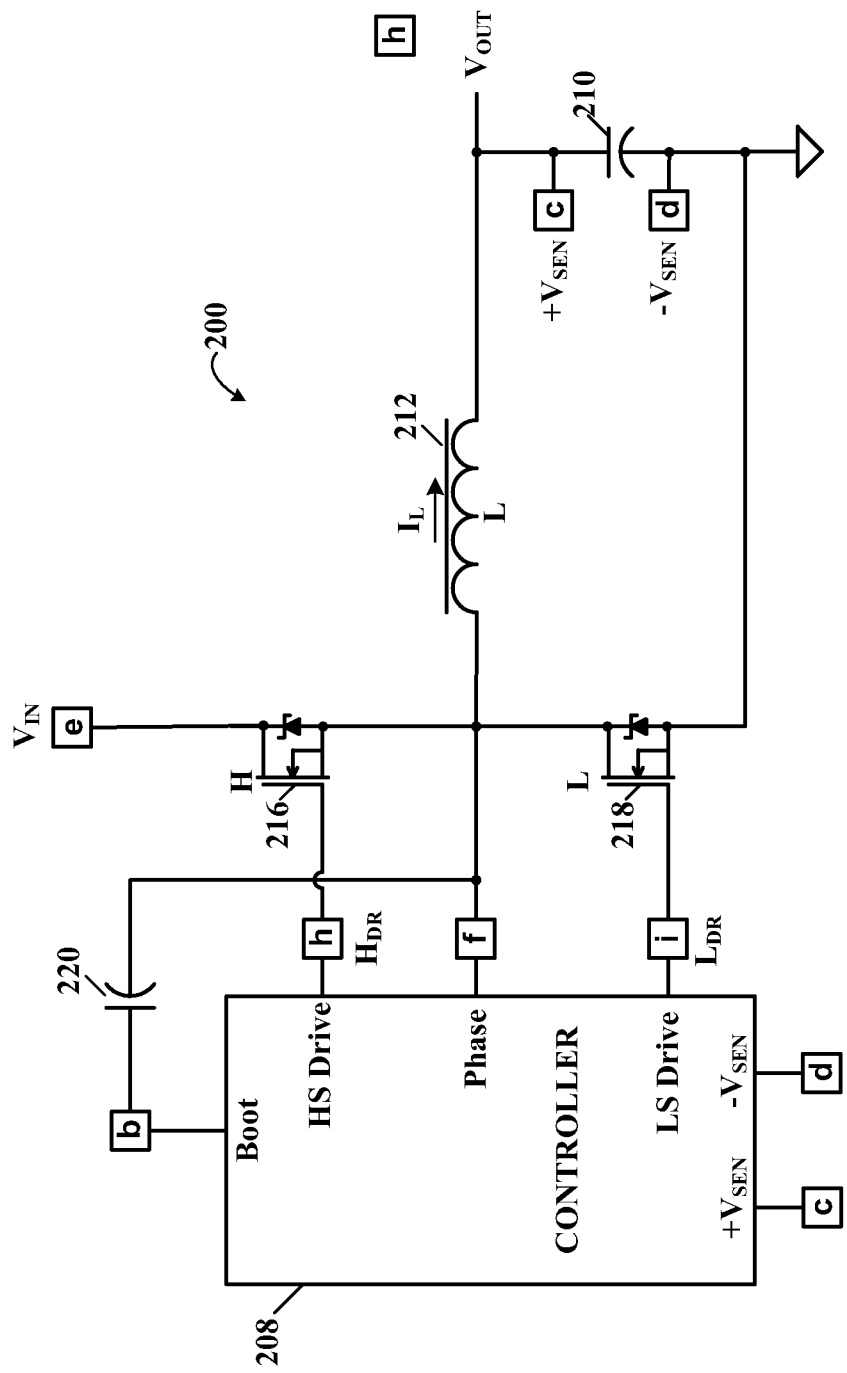
FIG. 2 illustrates a schematic diagram of a typical SMPS having a synchronous converter.

Referring to FIG. 2, depicted is a schematic diagram of a typical SMPS having a synchronous converter. A synchronous converter of a SMPS, generally represented by the numeral 200, comprises a controller 208, a first power switch (power transistor), hereinafter "high-side MOSFET 216;" a second power switch (power transistor), hereinafter "low-side MOSFET 218;" an inductor 212, a boot capacitor 220 and an output capacitor 210. The high-side and low-side MOSFETs 216 and 218, respectively, control power to a load (not shown) connected at Vout. When the high-side MOSFET 216 is on, a supply voltage, Vin, charges the inductor 212 and the capacitor 210 whereby current is supplied to the load (not shown). When a voltage on the capacitor 210 reaches a predefined set point voltage measured at +Vsen and −Vsen, the controller 208 turns off the high-side MOSFET 216 thereby interrupting the current, $I_L$, flowing through the inductor 212. The low-side MOSFET 218 may also be referred to as the "synchronous MOSFET" and the high-side MOSFET 216 may also be referred to as the "switching/control MOSFET."

In steady state conditions of the SMPS 200, the low-side MOSFET 218 is driven such that it is complimentary with respect to the high-side MOSFET 216, i.e., when the high-side MOSFET 216 is on the low-side MOSFET 218 is off. The controller 208 turns the high-side MOSFET 216 on and off, and the low-side MOSFET 218 off and on at a duty cycle that maintains the output voltage, Vout, at substantially the predefined set point voltage.

In both the asynchronous and synchronous converter topologies (FIGS. 1 and 2, respectively), the effective power switch is the high-side MOSFET 116, 216 that controls when energy is built up in the inductor 112, 212 and when to force the current, $I_L$, therein to start freewheeling. An advantage of the synchronous converter is higher conversion efficiency since power losses in the low-side MOSFET 218 are less than in a diode 118. However problems may exist when the synchronous converter is operating in the DCM and being used as a battery charger. Battery current reversal may occur with a synchronous converter when in the DCM because the low-side MOSFET 218 conducts current bi-directionally. This will not happen in an asynchronous converter when in the DCM because the diode 118 only conducts current in one direction.

Figure 3:
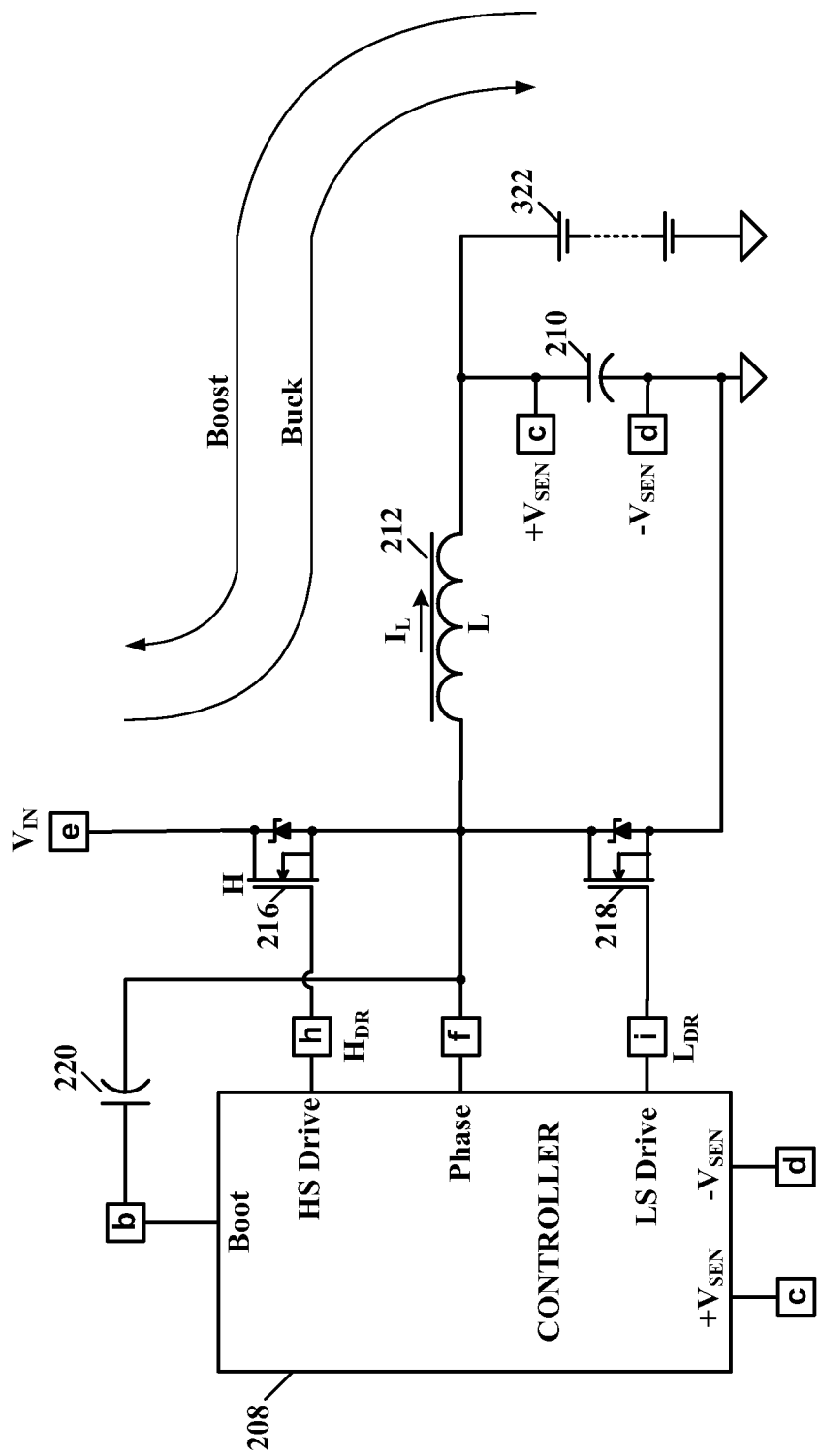
FIG. 3 illustrates a generic schematic diagram of a SMPS having a synchronous converter for charging a battery.

Referring to FIG. 3, depicted is a schematic diagram of a SMPS having a synchronous converter for charging a battery. The synchronous converter 200 shown in FIG. 2 and described hereinabove is connected to a battery 322. The synchronous buck converter 200 seen from the battery 322 side is a boost converter wherein start-up conditions are problematic. A very small duty cycle for the buck converter (when in DCM) is a very large duty cycle for the boost converter. When the synchronous converter is operating in DCM there is a chance that current will be drawn from the battery for a short period of time and injected back into the power source, Vin. There also will be large voltage spikes on the input side (Vin). This same issue appears for synchronous single-ended primary-inductor converter (SEPIC) and inverse SEPIC or ZETA converters.

Prior technology solutions to the aforementioned problems when using a SMPS synchronous converter as a battery charger have been for example: A power diode in series with the battery, but the diode has high power dissipation. A switch in series with the battery, but the switch requires additional components for control. Using the synchronous converter in a diode emulation mode wherein a very fast comparator (not shown) turns off the low-side MOSFET 218 when the inductor 212 current, $I_L$, drops to zero during DCM.

Figure 4:
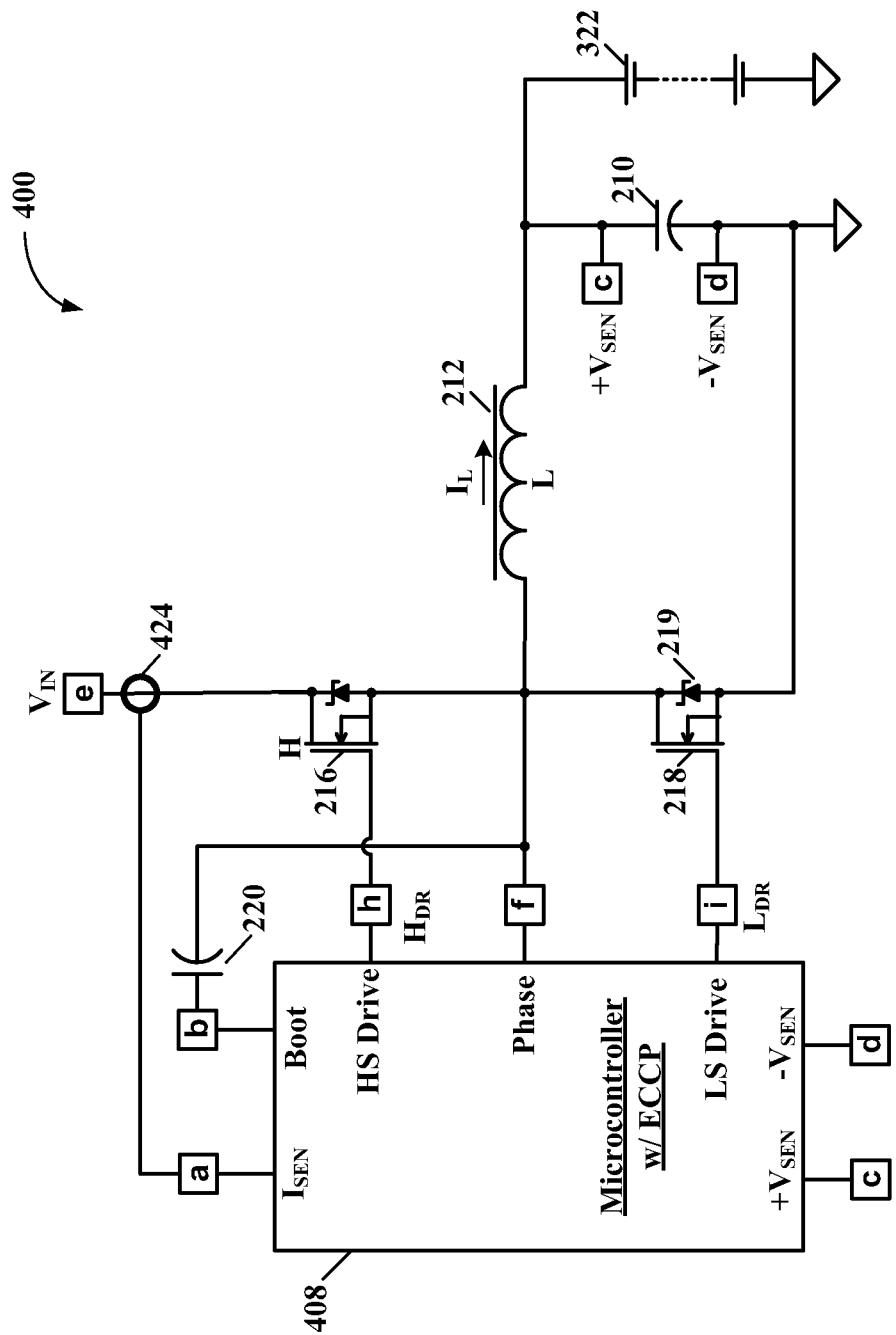
FIG. 4 illustrates a schematic diagram of a SMPS having selectable asynchronous and synchronous converter modes for charging a battery, according to a specific example embodiment of this disclosure.

Referring to FIG. 4, depicted is a schematic diagram of a SMPS having selectable asynchronous and synchronous converter modes for charging a battery, according to a specific example embodiment of this disclosure. A SMPS having selectable asynchronous and synchronous converter modes for charging a battery, generally represented by the numeral 400, comprises a microcontroller 408, a first power switch (power transistor), hereinafter "high-side MOSFET 216;" a second power switch (power transistor), hereinafter "low-side MOSFET 218;" an inductor 212, a boot capacitor 220, an output capacitor 210, a output current sensor 424 and a battery 322. The SMPS batter charger 400 functions in substantially the same way as the synchronous converter 200 shown in FIG. 2 and described hereinabove except that current supplied to the battery 322 may be measured by the output current sensor 424.

When the measured output current is less than a certain current value (e.g., low current value) the synchronous converter rectification may be disabled, and only the high-side MOSFET 216 is driven on, e.g., hard conduction. During low output current the low-side MOSFET 218 is not driven at all (turned off) and the body diode 219 thereof serves the same function as the power diode 118 shown in FIG. 1. A power diode (not shown) coupled in parallel with the low-side MOSFET 218 may also be used for the same purpose as the body diode 219. When the output current is greater than the certain current value, synchronous converter operation using both the high-side MOSFET 216 and the low-side MOSFET 218 may be used for best efficiency. The certain current value is not critical, nor are complex high speed circuits, e.g., high speed voltage comparator, required to measure the battery charging current. A simple sample and analog-to-digital conversion circuit may be used to supply the microcontroller 408 with the approximate output current measurement information. For asynchronous start-up of the SMPS converter shown in FIG. 4, a few pulses may be required from the low-side MOSFET 218 to charge up the boot capacitor 220.

It is contemplated and with the scope of this disclosure that any type of microcontroller and the like that has dead time control, and capture, compare and pulse with modulation (PWM) (CCP) capabilities may be used in the circuit shown in FIG. 4. One having ordinary skill in the art of digital integrated circuits and switch mode power supplies, and having the benefit of this disclosure could apply the teachings of this disclosure to specific battery charger circuit designs. The microcontroller driving the high-side MOSFET 216 and the low-side MOSFET 218 should have CCP capabilities, and preferably enhanced CCP (ECCP) capabilities. A microcontroller with ECCP capabilities will provide for programmable deadband delay and enhanced PWM auto-shutdown. See "PIC Microcontroller CCP and ECCP Tips 'n Tricks," chapter 3, available at www.microchip.com, and is hereby incorporated by reference herein for all purposes.

Figure 5:
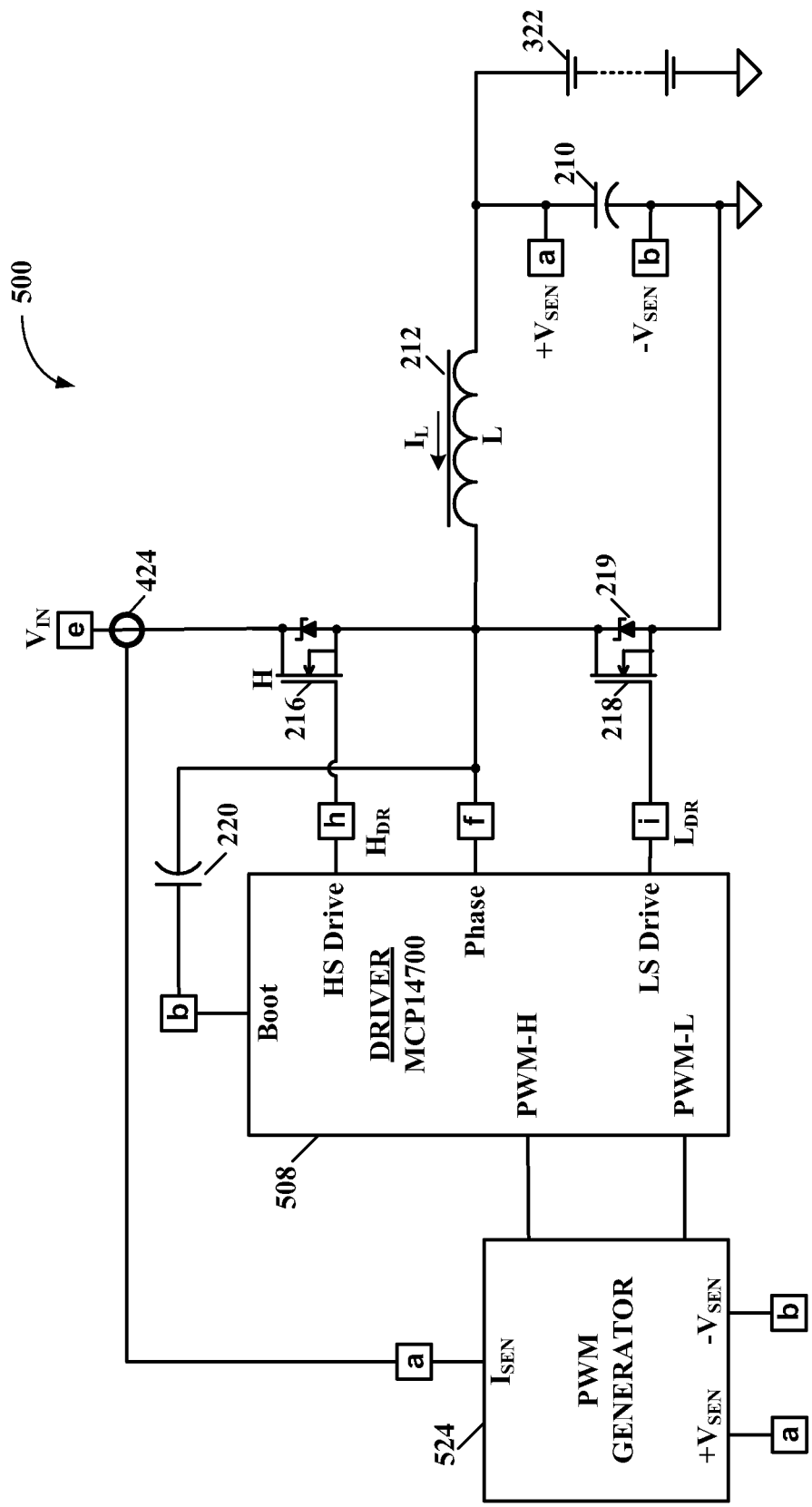
FIG. 5 illustrates a schematic diagram of a SMPS having selectable asynchronous and synchronous converter modes for charging a battery, according to another specific example embodiment of this disclosure.

Referring to FIG. 5, depicted is a schematic diagram of a SMPS having selectable asynchronous and synchronous converter modes for charging a battery, according to another specific example embodiment of this disclosure. A SMPS having selectable asynchronous and synchronous converter modes for charging a battery, generally represented by the numeral 500, comprises a pulse width modulation (PWM) generator 524, a dual MOSFET driver 508, a first power switch (power transistor), hereinafter "high-side MOSFET 216;" a second power switch (power transistor), hereinafter "low-side MOSFET 218;" an inductor 212, a boot capacitor 220, an output capacitor 210, a output current sensor 424 and a battery 322. The SMPS batter charger 500 functions in substantially the same way as the selectable asynchronous and synchronous converter 400 shown in FIG. 4 and described hereinabove except that the microcontroller 408 has been replaced by the PWM generator 524 and the dual MOSFET driver 508, otherwise operation thereof is the same. The dual MOSFET driver 508 may be, for example is but not limited to, a Microchip MCP14700 dual input synchronous MOSFET driver, wherein more detailed description and specifications thereof are available at www.microchip.com, and is hereby incorporated by reference herein for all purposes.

Figure 6:
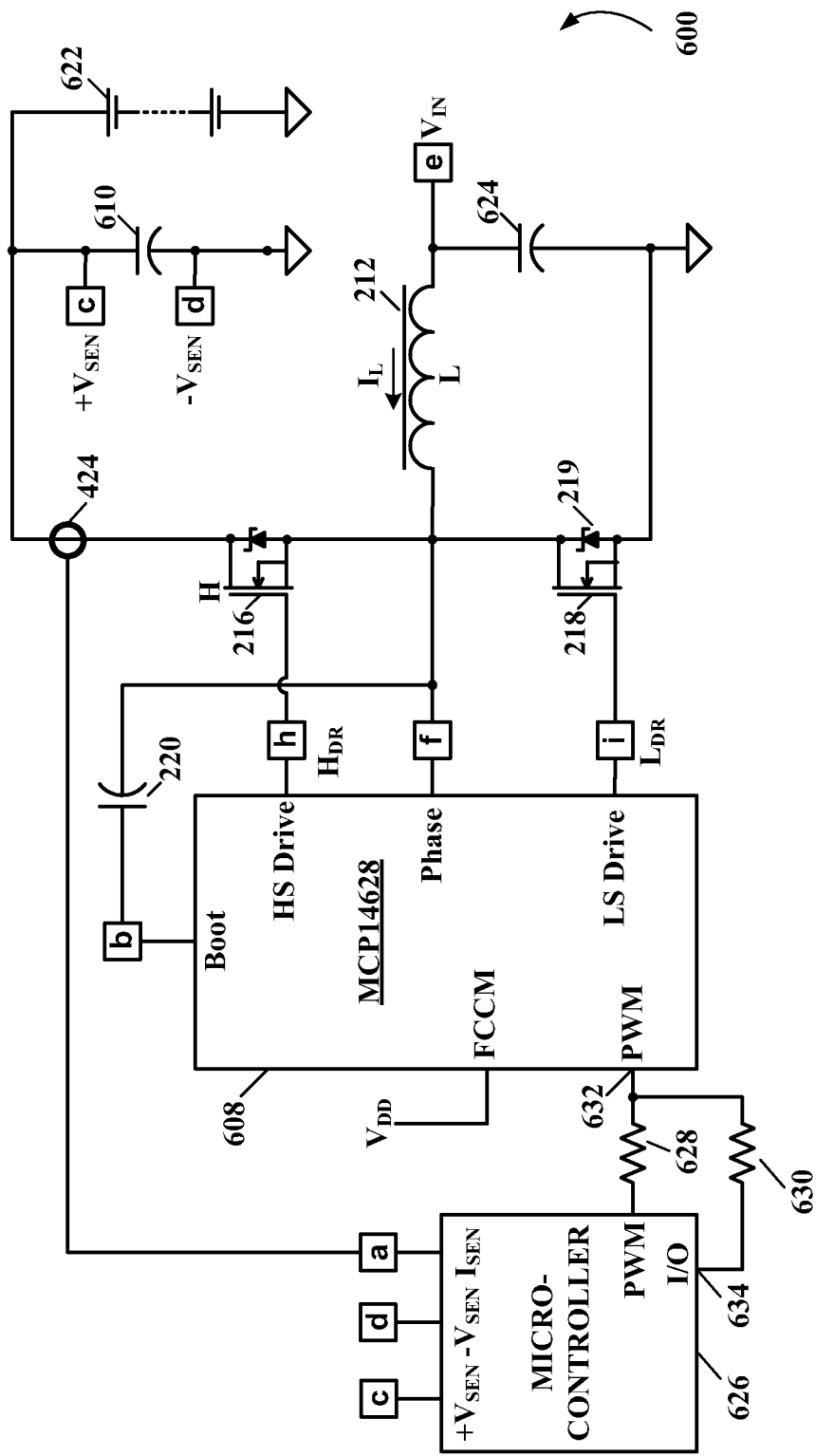
FIG. 6 illustrates a schematic diagram of a SMPS having selectable asynchronous and synchronous converter modes for charging a battery, according to yet another specific example embodiment of this disclosure.

Referring to FIG. 6, depicted is a schematic diagram of a synchronous SMPS having selectable asynchronous and synchronous converter modes for charging a battery, according to yet another specific example embodiment of this disclosure. A SMPS having selectable asynchronous and synchronous converter modes for charging a battery, generally represented by the numeral 600, comprises a microcontroller 626 having CCP capabilities, a dual MOSFET driver 608, a first power switch (power transistor), hereinafter "high-side MOSFET 216;" a second power switch (power transistor), hereinafter "low-side MOSFET 218;" an inductor 212, a boot capacitor 220, an input capacitor 624, an output capacitor 610, a output current sensor 424 and a battery 622. The SMPS battery charger 600 is configured as a "boost mode" converter.

The dual MOSFET driver 608 has a unique capability in that a PWM input 632 thereof is adapted to control the high current low drive, $L_{DR}$, and high drive, $H_{DR}$, signals. These signals have three distinct operating modes depending upon the state of the PWM input signal. A logic low logic level on the PWM input will cause the low drive signal, $L_{DR}$, to be high and the high drive signal, $H_{DR}$, to be low. When the PWM signal transitions to a logic high, the low drive signal, $L_{DR}$, goes to a low and the high drive signal, $H_{DR}$, goes to a high. The third operating mode of the PWM drive signal occurs when the signal at the PWM input 632 is set to a value substantially equal to one-half of the voltage difference between the logic low and logic high voltages, hereinafter "half logic level."

When the PWM signal dwells at the half logic level voltage for about 175 nanoseconds (typically) the dual MOSFET driver 608 disables both the low drive, $L_{DR}$, and high drive, $H_{DR}$, signals. Both of these drive signals are pulled to and are held low until the PWM signal at the PWM input 632 moves beyond the half logic level, e.g., toward the logic low or the logic high level, thereafter the dual MOSFET driver 608 removes the shutdown state of the drive signals and returns to normal synchronous operation thereof. A programmable input-output (I/O) pin 634 of the microcontroller 626 may be used in combination with two voltage divider resistors 628 and 630 of substantially the same value, e.g., 1,000 ohms, to provide the three logic level states.

For example, (1) when the I/O pin 634 is at a high logic level and the PWM output 636 from the microcontroller 626 is at a high logic level, the signal at the PWM input 632 will be at the high logic level; (2) when the I/O pin 634 is at a high logic level and the PWM output 636 is at a low logic level, the signal at the PWM input 632 will be at the half logic level; (3) when the I/O pin 634 is at a low logic level and the PWM output 636 is at a low logic level, the signal at the PWM input 632 will be at the low logic level, and (4) when the I/O pin 634 is at a low logic level and the PWM output 636 is at a high logic level, the signal at the PWM input 632 will be at the half logic level. By using the PWM output 636 and I/O pin 634 combinations (1) and (3) the SMPS 600 will operate in a normal synchronous mode. By using the PWM output 636 and I/O pin 634 combinations (2) or (4) the SMPS 600 will operate in an asynchronous mode. The dual MOSFET driver 608 may be, for example but not limited to, a Microchip MCP14628, wherein more detailed description and specifications thereof are available at www.microchip.com, and is hereby incorporated by reference herein for all purposes.

Figure 7:
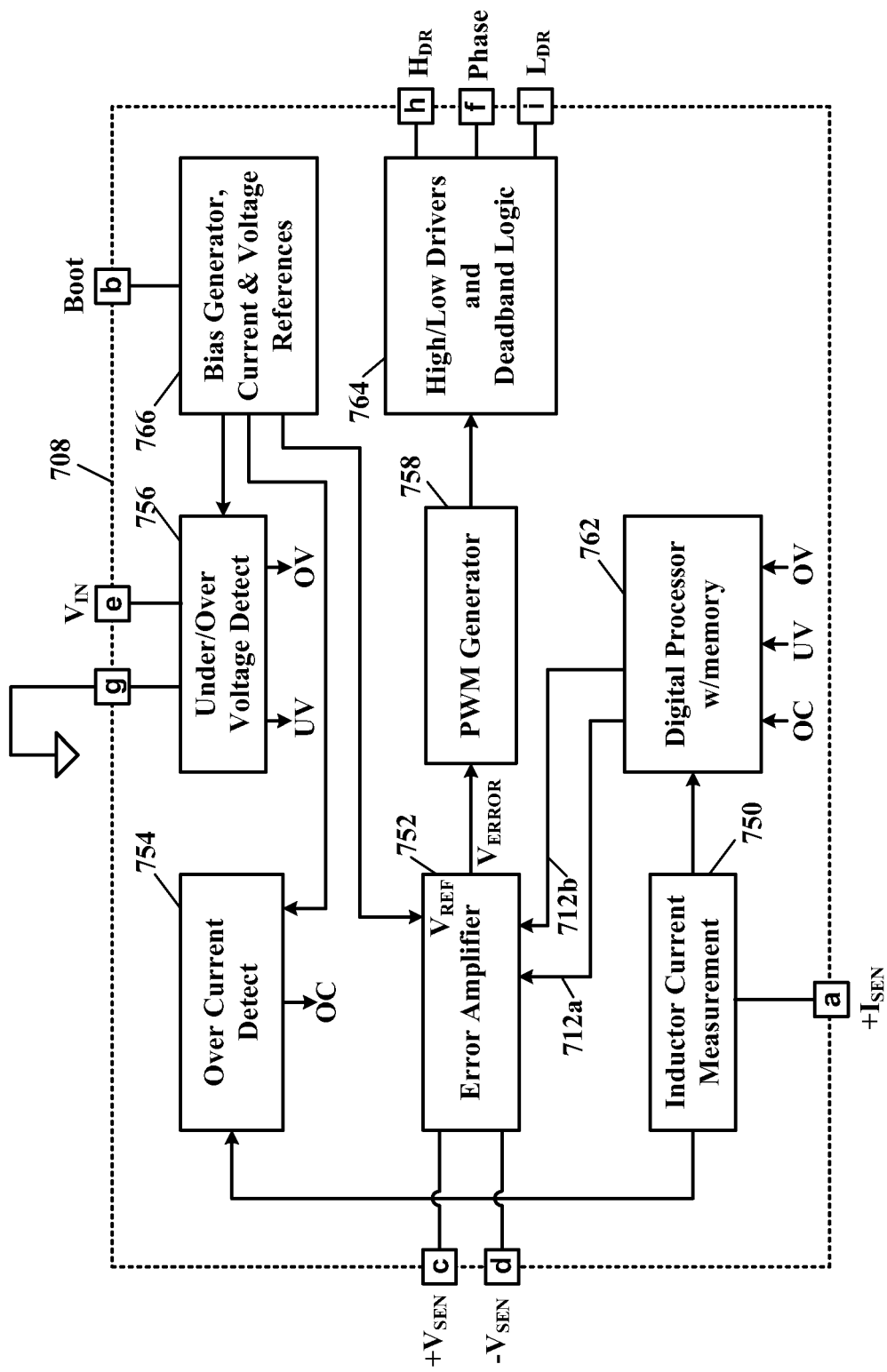
FIG. 7 illustrates a more detailed schematic block diagram of a control circuit shown in FIG. 4, according to the specific example embodiments of this disclosure.

Referring to FIG. 7, depicted is a more detailed schematic block diagram of a controller as shown in FIG. 4, according to the specific example embodiments of this disclosure. The control circuit 708, e.g., a mixed signal capable (both analog and digital functions) microcontroller, may comprise a digital processor with memory 762, high and low switch drivers having deadband logic represented by function block 764, bias generator, current and voltage reference circuits 766; under and over voltage detectors 756, a PWM generator 758, an over current detector 754, a voltage comparison circuit 752, and a power inductor current measurement circuit 750.

The high and low switch drivers of the function block 764 are coupled to and control when the high and low switches 216 and 218 turn on and off. In addition the deadband logic of the function block 764 prevents the high and low switches 216 and 218 from ever being on at the same time ("shoot through"), preferably, there is a deadband where both of the high and low switches 216 and 218 are off. The PWM generator 758 controls when and for how long the power inductor 212 is coupled to and is being charged from the power source, Vin.

The boot voltage capacitor 220 supplies power to the bias generator, current and voltage reference circuits 766 which in turn supply precision current and voltage reference values that are used by the current and voltage circuits 752, 754 and 756. The voltage comparison circuit 752 measures the output voltage and compares it to a reference voltage, $V_{REF}$, from the voltage reference circuit 766. An error signal from the voltage comparison circuit 752, representing the difference between a desired voltage value and the actual output voltage value, is applied to an error input of the PWM generator 758, wherein the PWM generator 758 adjusts its pulse waveform output to minimize that difference. The over current detector 754 monitors the current to the power inductor 212, and the under and over voltage detectors 756 monitor the input voltage to the SMPS for undesirable e.g., abnormal, conditions, e.g., inductor current exceeds allowable design limits, input voltage is above or below a design operating input voltage range. The power inductor current measurement circuit 750 measures SMPS power inductor current. It is contemplated and within the scope of this disclosure that any method and/or circuit for measuring current through the power inductor 212 may be used, and one having ordinary skill in the design of SMPS systems and having the benefit of this disclosure would understand how to implement such a current measurement circuit. Various inductor current measurement circuits are more fully described in commonly owned U.S. patent application Ser. No. 12/959,837, by Scott Dearborn, filed Dec. 3, 2010, and is hereby incorporated by reference herein for all purposes.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A switch-mode power supply (SMPS) having selectable asynchronous and synchronous converter modes, said SMPS comprising:
    a high-side power transistor;
    a low-side power transistor coupled in series with the high-side power transistor;
    a power diode coupled in parallel with the low-side power transistor;
    a filter capacitor coupled in parallel with the series connected high-side and low-side power transistors;
    a power inductor having a first end coupled to a junction between the high-side and the low-side power transistors and a second end coupled to a power source;
    a current sensor; and
    a dual power transistor driver having a high-drive output coupled to a control input of the high-side power transistor, a low-drive output coupled to a control input of the low-side power transistor, and a pulse width modulation (PWM) input adapted for receiving three voltage levels, wherein
    when the PWM input is at a low logic level the low-drive output is asserted and the low-side power transistor is on,
    when the PWM input is at a high logic level the high-drive output is asserted and the high-side power transistor is on, and
    when the PWM input is at a half logic level the high-drive and low-drive outputs are both deasserted and the high-side and low-side power transistors are both off;
    first and second resistors having first ends coupled to the PWM input of the dual power transistor driver, wherein the first and second resistors are substantially the same resistances; and
    a microcontroller having a PWM output coupled to a second end of the first resistor, a digital output coupled to a second end of the second resistor, a voltage sense input coupled to the filter capacitor, and a current sense input coupled to the current sensor;
    wherein the microcontroller supplies a PWM signal from the PWM output thereof and has a duty cycle determined by a voltage on the filter capacitor compared to a voltage reference;
    wherein
    when a current measured by the current sensor is less than a certain current value a logic level from the digital output is opposite to a logic level from the PWM output and the PWM input is at the half logic level, and
    when the current measured by the current sensor is equal to or greater than the certain current value the logic level from the digital output is at the same logic level as the logic Level from the PWM output, and the PWM input is at the same logic level as the PWM output from the microcontroller.

2. The SMPS according to claim 1, wherein the high-side and low-side power transistors are power metal oxide semiconductor (MOS) field effect transistors (FETs) and the power diode comprises a body diode of the low-side power MO PET.

3. The SMPS according to claim 1, further comprising a battery coupled to the filter capacitor, wherein the battery is charged thereby.

4. The SMPS according to claim 1, wherein the certain current value is substantially less than a maximum current value of the SMPS.

5. The SMPS according to claim 1, wherein the certain current value is greater than zero amperes.

6. The SMPS according to claim 1, wherein when the current measured by the current sensor is less than the certain current value the SMPS operates in the asynchronous converter mode.

7. The SMPS according to claim 1, wherein when the current measured by the current sensor is equal to or greater than the certain current value the SMPS operates in the synchronous converter mode.

* * * * *